United States Patent
Kim et al.

(10) Patent No.: US 10,804,308 B2
(45) Date of Patent: Oct. 13, 2020

(54) IMAGE SENSING DEVICE INCLUDING NOISE BLOCKING STRUCTURE

(71) Applicant: SK hynix Inc., Icheon-si (KR)

(72) Inventors: Jong Eun Kim, Daejeon (KR); Ho Young Kwak, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/460,932

(22) Filed: Jul. 2, 2019

(65) Prior Publication Data
US 2020/0194475 A1 Jun. 18, 2020

(30) Foreign Application Priority Data
Dec. 12, 2018 (KR) .................. 10-2018-0159793

(51) Int. Cl.
*H01L 27/146* (2006.01)

(52) U.S. Cl.
CPC .... *H01L 27/1463* (2013.01); *H01L 27/14612* (2013.01); *H01L 27/14621* (2013.01); *H01L 27/14627* (2013.01)

(58) Field of Classification Search
CPC ........... H01L 27/1463; H01L 27/14603; H01L 27/14636; H01L 27/1464; H01L 27/14687
See application file for complete search history.

(56) References Cited

U.S. PATENT DOCUMENTS

| 9,666,630 | B2 | 5/2017 | Chuang et al. | |
|---|---|---|---|---|
| 2013/0323875 | A1* | 12/2013 | Park | H01L 27/1463 438/70 |
| 2014/0267860 | A1* | 9/2014 | Dai | H01L 27/14687 348/308 |
| 2016/0197114 | A1* | 7/2016 | Chuang | H01L 27/1464 257/292 |

FOREIGN PATENT DOCUMENTS

KR    10-2013-0083361    7/2013

* cited by examiner

*Primary Examiner* — Changhyun Yi
(74) *Attorney, Agent, or Firm* — Perkins Coie LLP (57) ABSTRACT

An image sensing device including a noise blocking structure is disclosed. The image sensing device includes a semiconductor substrate structured to support a plurality of image pixels producing signals response to received incident light, a logic circuit configured to process the signals read out from the image pixels, and a noise blocking structure coupled to the logic circuit to reduce a noise generated by the logic circuit. The noise blocking structure formed to extend in a straight line without any bending portion in a first direction, and to pass through the semiconductor substrate in a second direction that is perpendicular to the first direction.

22 Claims, 11 Drawing Sheets

IMAGE SENSING DEVICE INCLUDING NOISE BLOCKING STRUCTURE

CROSS-REFERENCE TO RELATED APPLICATION

This patent document claims priority to and benefits of Korean patent application No. 10-2018-0159793, filed on Dec. 12, 2018, which is incorporated herein by reference in its entirety.

TECHNICAL FIELD

The technology and implementations disclosed in this patent document relate to an image sensing device.

BACKGROUND

An image sensing device is a device for capturing at least one image using semiconductor characteristics that react to light. In recent times, with the increasing development of computer industries and communication industries, demand for high-quality and high-performance image sensors is rapidly increasing in various fields, for example, digital cameras, camcorders, personal communication systems (PCSs), game consoles, surveillance cameras, medical micro-cameras, robots, etc.

Image sensing devices may be broadly classified into CCD (Charge Coupled Device)-based image sensing devices and CMOS (Complementary Metal Oxide Semiconductor)-based image sensing devices. Recently, since an analog control circuit and a digital control circuit can be directly implemented as a single integrated circuit (IC), CMOS-based image sensing devices have rapidly come into widespread use.

SUMMARY

Various embodiments of the disclosed technology are directed to an image sensing device including a noise blocking structure. Some implementations of the disclosed technology relate to an image sensing device capable of efficiently preventing noise generated from a logic circuit block embedded therein from leaking outside the logic circuit block and causing undesired affects to other blocks of the image sensing device.

In one example aspect of the disclosed technology, an image sensing device may include a semiconductor substrate structured to support a plurality of image pixels producing signals response to received incident light, a logic circuit configured to process the signals read out from the image pixels, and a noise blocking structure coupled to the logic circuit to reduce a noise generated by the logic circuit. The noise blocking structure may be formed to extend in a straight line without any bending portion in a first direction, and to pass through the semiconductor substrate in a second direction that is perpendicular to the first direction.

In another example aspect of the disclosed technology, an image sensing device may include a semiconductor substrate configured to include image pixels producing signals upon a detection of an incident light and a logic circuit region processing the signals produced by the image pixels, and a noise blocking structure disposed at the semiconductor substrate and including a first blocking structure including first noise blocking portions distanced apart from each other by an opening and partially surrounding the logic circuit region, each of the first noise blocking portions extending in a straight line, and a second blocking structure disposed around the opening to prevent the noise from leaking out of the first blocking structure and including second noise blocking portions extending in a straight line.

In another example aspect of the disclosed technology, an image sensing device may include a pixel region provided with a plurality of image pixels producing signals upon a detection of an incident light, and a logic region located outside of the pixel region. The logic region may include a logic circuit block configured to process the signals produced by the image pixels, a first noise blocking structure disposed outside of the logic circuit and discontinuously surround the logic circuit, and a second noise blocking structure disposed outside of the first nose blocking structure and including multiple discrete portions structured in a maze-like arrangement.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the present disclosure will become readily apparent with reference to the following detailed description when considered in conjunction with the accompanying drawings.

DETAILED DESCRIPTION

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

The image sensing device may include a pixel array, an analog block for driving the pixel array and reading out signals of the pixel array, and a digital block for processing the signals read out from the analog block. As one way to improve image quality, it can be considered to design the analog block including the pixel array to be less affected by external noises. For example, a high-speed operation is needed for high-definition image sensing devices, which may cause noises. If the noises caused by the high-speed operation is applied to the analog block, the image quality can be negatively affected.

The disclosed technology can be implemented to provide an image sensing device including a noise blocking structure which can prevent noise generated in a logic circuit block from negatively affecting to other parts of the image sensing device.

Figure 1:
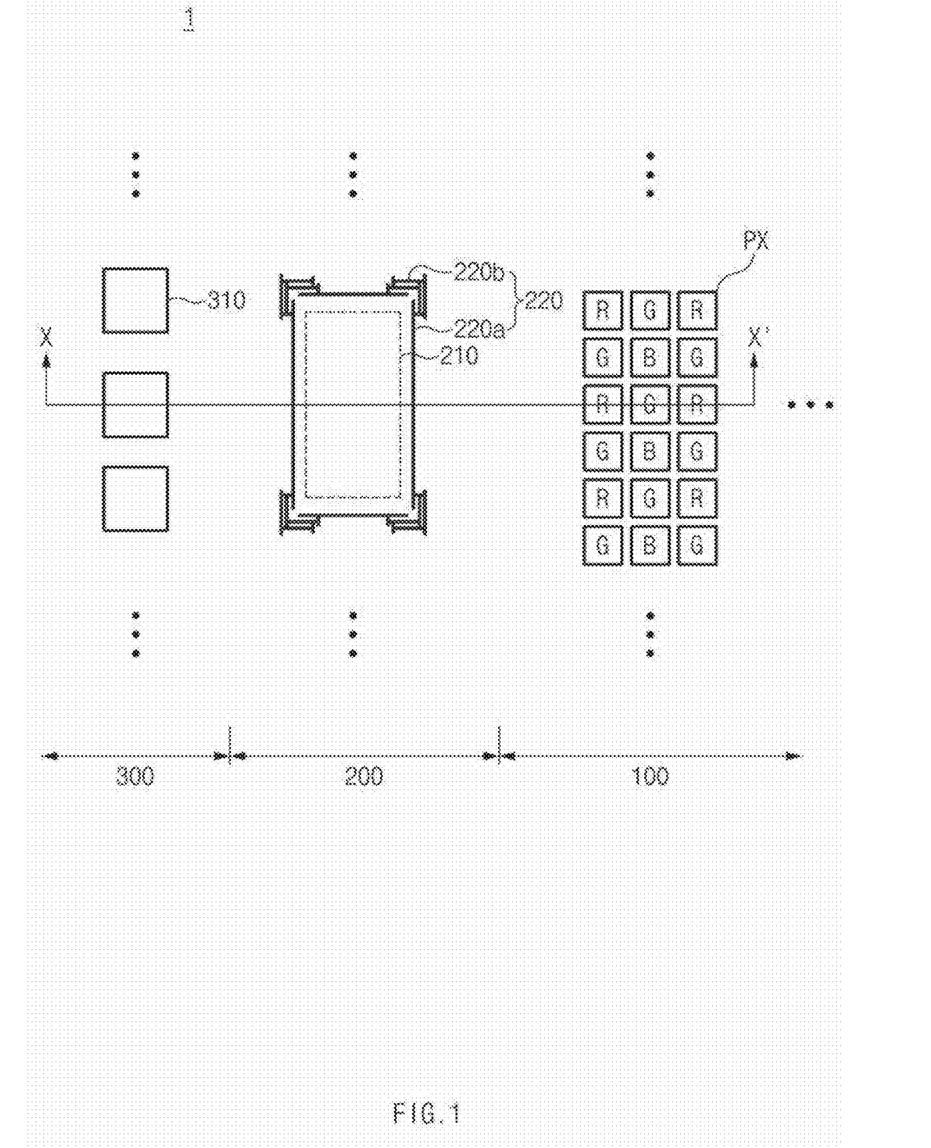
FIG. 1 is an example of a plan view illustrating an example of an image sensing device based on some implementations of the disclosed technology.
Figure 2:
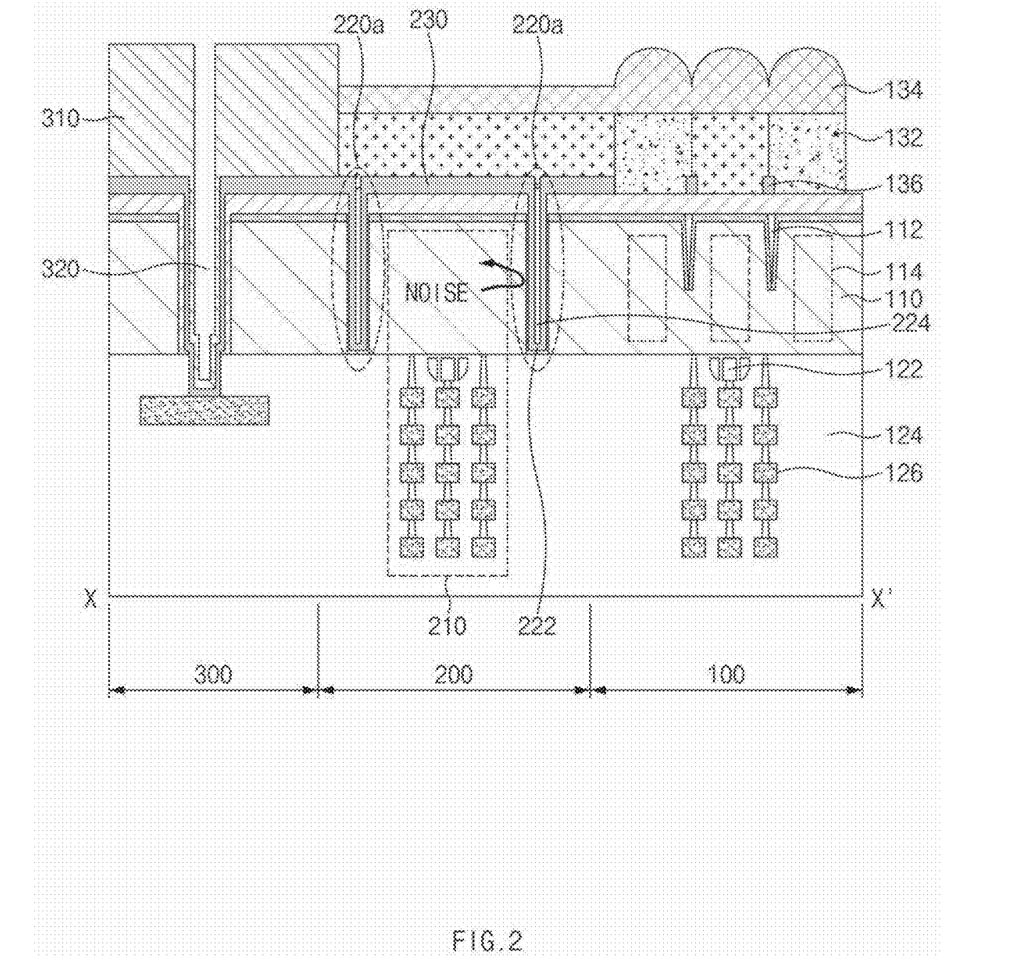
FIG. 2 is a cross-sectional view illustrating an example of the image sensing device taken along the line X-X' shown in FIG. 1.

FIG. 1 is an example of a plan view illustrating an image sensing device 1 according to an embodiment of the disclosed technology. FIG. 2 is a cross-sectional view illustrating the image sensing device taken along the line X-X' shown in FIG. 1.

Referring to FIGS. 1 and 2, the image sensing device 1 may include a pixel region 100, a logic region 200, and a pad region 300.

The pixel region 100 may include a plurality of image pixels (PXs), each of which detects incident light and outputs an electrical signal corresponding to the detected light. The image pixels (PXs) may selectively detect red light (R), green light (G), or blue light (B), and may be arranged in a Bayer pattern.

At least one device isolation film 112 for defining active regions of unit pixels (PXs) may be formed in a semiconductor substrate 110 of the pixel array 100. Active regions defined by the device isolation film 112 may include first active regions in which photoelectric conversion elements (e.g., photodiodes) 114 are formed and second active regions in which transistors for reading out photoelectric conversion signals are formed.

A plurality of sensing elements (pixel transistors) to read out photoelectric conversion signals as well as to control the unit pixels, a plurality of interlayer insulation films 124, and a plurality of metal lines 126 formed in the interlayer insulation films 124 may be formed at a front side of a semiconductor substrate 110 in the pixel region 100. At a back side of the semiconductor substrate 110 in the pixel region 100, a plurality of color filters 132, a plurality of microlenses 134, and a grid structure 136 may be formed. The plurality of color filters 132 may perform filtering of visible light so that only specific-color light R, G, or B from among visible light can pass through color filters of the color filter layer 132. The microlenses 134 may focus incident light received from an external part, and may transmit the focused incident light to the color filter layers 132. The grid structure 136 may be disposed between the color filters 132 so as to prevent occurrence of crosstalk between contiguous unit pixels.

The logic region 200 may be located at an outer wall of the pixel region 100, and may include a plurality of logic circuit blocks 210 in which the logic circuits for processing signals read out from the pixel region 100 are formed in units of a block. The logic circuit blocks 210 may be formed at the front side of the semiconductor substrate 110 while the color filters 132 and the microlenses 134 may be formed at the rear side of the semiconductor substrate 100. Although the logic region 200 of FIG. 1 includes one logic circuit block 210 for convenience of description, the number of the logic circuit block included in the logic region is not limited to one, and other implementations are also possible.

In the logic region 200 of the semiconductor substrate 110, a noise blocking structure 220 may be formed to prevent noise generated from the logic circuit block 210 from entering the pixel region 100. In some implementations, the noise blocking structure 220 may be formed to surround the corresponding logic circuit block 210. The noise blocking structure 220 may include a first blocking structure 220a and a second blocking structure 220b to pass through the semiconductor substrate 110 of the logic region 200. In some implementations, the first blocking structure 220a and the second blocking structure 220b have a barrier structure. The noise blocking structure 220 is structured to block charge carriers associated with undesired noise in the logic circuity block 210 from going into other parts of the device so as to negatively impact the device signal processing performance.

Each of the first blocking structure 220a and the second blocking structure 220b may include a metal film 222 and an airgap 224. Although it is described as the metal film 222, it is not limited to the film only and any other structures including a metal can be used. In this case, the metal film 222 may be formed of or include a material (e.g., tungsten). In some implementations, the material of the metal film 222 may be identical not only to a material of a shielding metal film 230 shielding the logic region 200 but also to a material of a grid structure 136 of the pixel region 100. In some implementations, the shielding metal film 230 refers to the structure formed at the logic region 200. For example, when a metal film for shielding the logic region 200 is formed, the corresponding metal material may enter a through-region, resulting in formation of the metal film 222.

In some implementations, in a horizontal plane, each of the first blocking structure 220a and the second blocking structure 220b may be formed to extend in a straight line. Thus, the bending portion (edge) is not present in each of the first blocking structure 220a and the second blocking structure 220b, as shown in FIG. 1. In the example of FIG. 1, the first blocking structure 220a and the second blocking structure 220b may have multiple portions distanced apart from each other. Some of the multiple portions of the first blocking structure 220a extend in a first direction in the horizontal plane and some others of the multiple portions of the first blocking structure 220 extend in a second direction perpendicular to the first direction. In some implementations, in a vertical plane perpendicular to the horizontal plane, the first blocking structure 220a and the second blocking structure 220b may pass through the semiconductor substrate as shown in FIG. 2. In some implementations, the first blocking structure 220a and the second blocking structure 220b may include a plurality of barrier-shaped or plate-shaped noise blocking films.

Assuming a case where the noise blocking film is continuously formed to surround the entire logic circuit block 210 in the horizontal plane, then the noise blocking film has a certain portion in which the noise blocking film is bent around the certain portion (e.g., corner) of the noise blocking film. For example, since the noise blocking structure is formed to surround the logic circuit, the noise blocking structure has portions which extend in different directions and thus there exists a certain portion where the extending direction of the noise blocking film is changed. The existence of such a portion (e.g., a corner) makes it difficult to etch the semiconductor substrate 110 and/or form the through-hole in the semiconductor substrate 110 at or around the such portion. Thus, when the noise blocking structure is formed by etching or forming a through-hole in the semiconductor substrate 110, if the noise blocking structure has a bending portion, the noise blocking structure might be formed not as designed and the noise blocking structure might not operate as expected. In order to prevent such undesired situations, the disclosed technology provides the noise blocking structure 220 including plural noise blocking portions (e.g., films), each of the portions formed in a linear shape where the bending portion is not present in the horizontal plane.

The noise blocking structure 200 may include the noise blocking portions (e.g., films, hereinafter referred to as line-shaped noise blocking films for convenience of description but other structures than the film can be used for the noise blocking structure 200) formed in a line shape in the horizontal plane. For example, the noise blocking structure 220 may include a first blocking structure 220a provided with a plurality of line-shaped noise blocking films and a second blocking structure 220b provided with a plurality of line-shaped noise blocking films. In some implementations, the first blocking structure 220a may be arranged to surround the logic circuit block 210. The line-shaped noise blocking films of the first blocking structure 220a may have a belt shape surrounding the logic circuit block 210. The first blocking structure 220a may include openings disposed between adjacent two of the line-shaped noise blocking films, in which no noise blocking film is present. In the example of FIG. 1, the line-shaped noise blocking films are not disposed at the openings between the line-shaped noise blocking films and the openings between the line-shaped noise blocking films are open without the presence of the line-shaped noise blocking film. The line-shaped noise blocking films of the second blocking structure 220b may be disposed in a maze-like arrangement around an open portion of the first blocking structure 220a. In some implementations, the noise blocking films are labyrinthically arranged in multiple layers in the open portion. The noise blocking structure 220 will be described in more detail later in this patent document.

The pad region 300 may include a plurality of pads 310 through which the image sensing device is coupled to an external device. The pads 310 may be coupled to a metal line formed over the front side of the semiconductor substrate 110 through a through-hole 320 passing through the semiconductor substrate 110.

Figure 3:
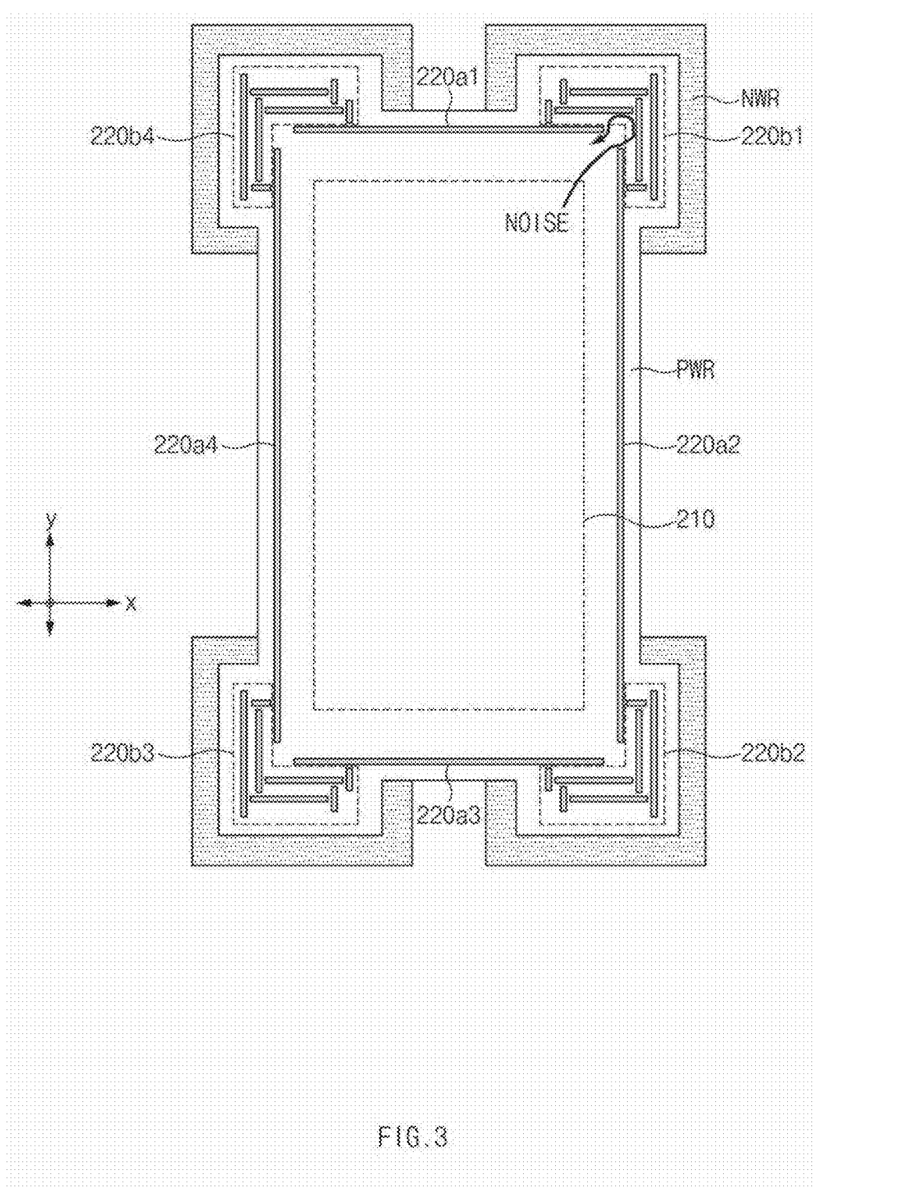
FIG. 3 is a plan view illustrating an example of a noise blocking structure based on some implementations of the disclosed technology.

FIG. 3 is an example of a plan view illustrating a noise blocking structure based on some implementations of the disclosed technology.

Referring to FIG. 3, the noise blocking structure 220 may include a first blocking structure 220a (including first noise blocking films 220a1 to 220a4) and a second blocking structure 220b (including second noise blocking films 220b1 to 220b4). The first blocking structure 220a and the second blocking structure 220b are not limited to have film structures, other structures can be used to provide the first and second blocking structures 220a and 220b.

The first blocking structure 220a may include a plurality of line-shaped noise blocking films 220a1 to 220a4. The first blocking structure 220a may be formed in a manner that the line-shaped noise blocking films 220a1 to 220a4 are spaced apart from each other by a predetermined distance and surround the logic circuit block 210 (i.e., a region including logic circuits in the semiconductor substrate 110). For example, the first blocking structure 220a may include plural line-shaped noise blocking films 220a1 to 220a4 arranged in the semiconductor substrate 110 except certain portions between the line-shaped noise blocking films 220a1 to 220a4. When the first blocking structure 220a has a belt shape surrounding the logic circuit block 210, the certain portions between adjacent two of the line-shaped noise blocking films 220a1 to 220a4 are open without including the first blocking structure 220a, thereby providing openings in the first blocking structure 220a. In some implementations, the noise blocking films 220a1 to 220a4 may be arranged in different directions, e.g., X-axis and Y-axis directions, and the noise blocking films 220a1 to 220a4 may be spaced apart from each other by a predetermined distance without contacting each other.

As described above, the first blocking structure 220a may be formed to include plural line-shaped noise blocking films 220a1 to 220a4 which are spaced apart from each other by a predetermined distance instead of being formed as a continuously extending structure. Thus, the first blocking structure 220 may discontinuously surround the logic circuit block 210 except the openings between the adjacent two of the plural line-shaped noise blocking films 220a1 to 220a4. By configuring the first blocking structure 220a with the multiple portions and locating the multiple portions of the first blocking structure 22a at the semiconductor substrate 110 except the openings between the multiple portions, the first blocking structure 220a does not have any bending portion. The noise blocking films 220a1 to 220a4 may be formed to pass through the semiconductor substrate 110 in a Z-axis direction, as shown in FIG. 2. Thus, the noise blocking films 220a1 to 220a4 may be formed in a line shape in a horizontal direction (including, for example, X-axis and Y-axis directions) such that each of the noise blocking films 220a1 to 220a4 does not have any bending portion in the horizontal direction. In some implementations, the noise blocking films 220a1 to 220a4 may pass through the semiconductor substrate 110 in the vertical direction and may be formed in a barrier shape in a vertical direction (e.g., Z-axis direction).

Figure 4:
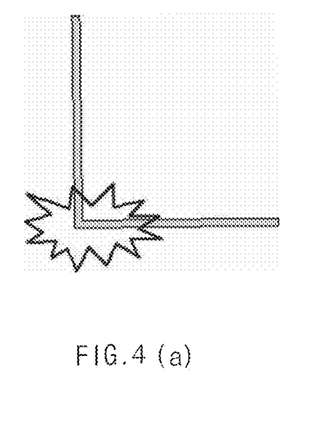
FIGS. 4a and 4b show examples of defects occurring in a noise blocking film of an image sensing device based on some implementations of the disclosed technology.

FIG. 4A shows the case that the noise blocking structure is formed as the entirely-connected single noise blocking unit (e.g., film) to continuously surround the entire logic circuit block 210. In this case, the entirely-connected single unit has a bending portion at a certain part of the unit as shown in FIG. 4A. As discussed above, the existence of the bending portion in the noise blocking structure makes it difficult to form the through-hole in the semiconductor substrate at or around such bending portion of the noise blocking structure. Thus, if the noise blocking film is formed to pass through the semiconductor substrate, there is a high possibility that the noise blocking film does not pass through the semiconductor substrate in the bending portion (e.g., the corner) as shown in FIG. 4B. In this case, when the noise blocking film is abnormally formed in the edge portion, noise may leak outside through the edge portion.

Therefore, some implementations of the disclosed technology suggest a design of the noise blocking structure 220 to include line-shaped noise blocking films only without including any bending portions. In some implementations, the first blocking structure 220a may be formed in a manner that the noise blocking films 220a1 to 220a4 surround the logic circuit block 210 except certain portions between the noise blocking films 220a1 to 220a4. In some implementations, the second blocking structure 220b may be formed in the certain portions between the noise blocking films 220a1 to 220a4 to surround gaps formed between the noise blocking films 220a1 to 220a4. If the noise blocking structure 220 includes the first blocking structure 220a only (e.g., the noise blocking films 220a1 to 220a4) without the second blocking structure 220b, the leakage of noise can occur through the certain portions between the noise blocking films 220a1 to 220a4. By including the second blocking structure 220b in the certain portions between the noise blocking films 220a1 to 220a4, it is possible to prevent leakage of noise from the logic circuit block to other parts of the image sensing device.

The second blocking structure 220b may include a plurality of line-shaped noise blocking films 220b1 to 220b4. In the same manner as in the noise blocking films 220a1 to 220a4, the noise blocking films 220b1 to 220b4 may be formed to extend in a straight line without any bending portion. The noise blocking films 220b1 to 220b4 may extend to pass through the semiconductor substrate 110 in a vertical direction. In some implementations, the noise blocking films 220b1 to 220b4 may have a barrier shape.

In the plan view, the second blocking structure 220b may include the line-shaped noise blocking films 220b1 to 220b4 arranged in multiple layers to form a maze-like arrangement. In some implementations, the noise blocking films 220b1 to 220b4 labyrinthically arranged. Thus, the second blocking structure 220b may be formed to surround the openings of the first blocking structure 220a, such that noise escaped outside through the openings of the first blocking structure 220a passes through the second blocking structure 220b instead of being immediately transferred to other parts of the image sensing device. By arranging the second blocking structure 220b in multiple layers and maze-like arrangement, the noise escaped through the openings of the first blocking structure 220a successively collides with the noise blocking films 220b1 to 220b4 to prevent noise from leaking from the noise blocking structure 220 and/or return the noise into the logic circuit block 210. As long as the second blocking structure 220b covers the openings of the first blocking structure 220a, the line-shaped noise blocking films 220b1~220b4 may be formed to be shorter than that of the linear-shaped noise blocking films 220a1 to 220a4.

The first blocking structure 220a and the second blocking structure 220b may be formed in a P-well region (PWR) of the semiconductor substrate 110, and an N-well region (NWR) may be formed in an outer wall of the P-well region (PWR) provided with the second blocking structure 220b. Thus, the N-well region (NWR) may be formed to surround the outer wall of the P-well region (PWR) provided with the second blocking structure 220b. By the above-mentioned arrangement of the P-well region and the N-well region, noise having positive (+) polarity (hereinafter referred to as positive (+) noise components) may be re-combined in the P-well region (PWR), such that the positive (+) noise components can disappear. Although some of the negative (−) noise components are unavoidably escaped outside the second blocking structure 220b, the escaped negative (−) noise components may be re-combined in the N-well region (NWR), such that the resultant positive (+) noise components may disappear.

Although the above-mentioned embodiment has exemplarily disclosed that the first blocking structure 220a has a belt shape and the certain portions of the belt shaped first blocking structure 220a include openings, other implementations are also possible. For example, the first blocking structure 220a may be arranged in various ways according to arrangement formats of the logic circuit block. In some implementations, the first blocking structure 220a may have a polygonal belt shape and the certain portions of the polygonal belt shaped first blocking structure 220a include openings.

FIGS. 5 to 10 are examples of cross-sectional views illustrating methods for forming noise blocking structures based on some implementations of the disclosed technology.

Figure 5:
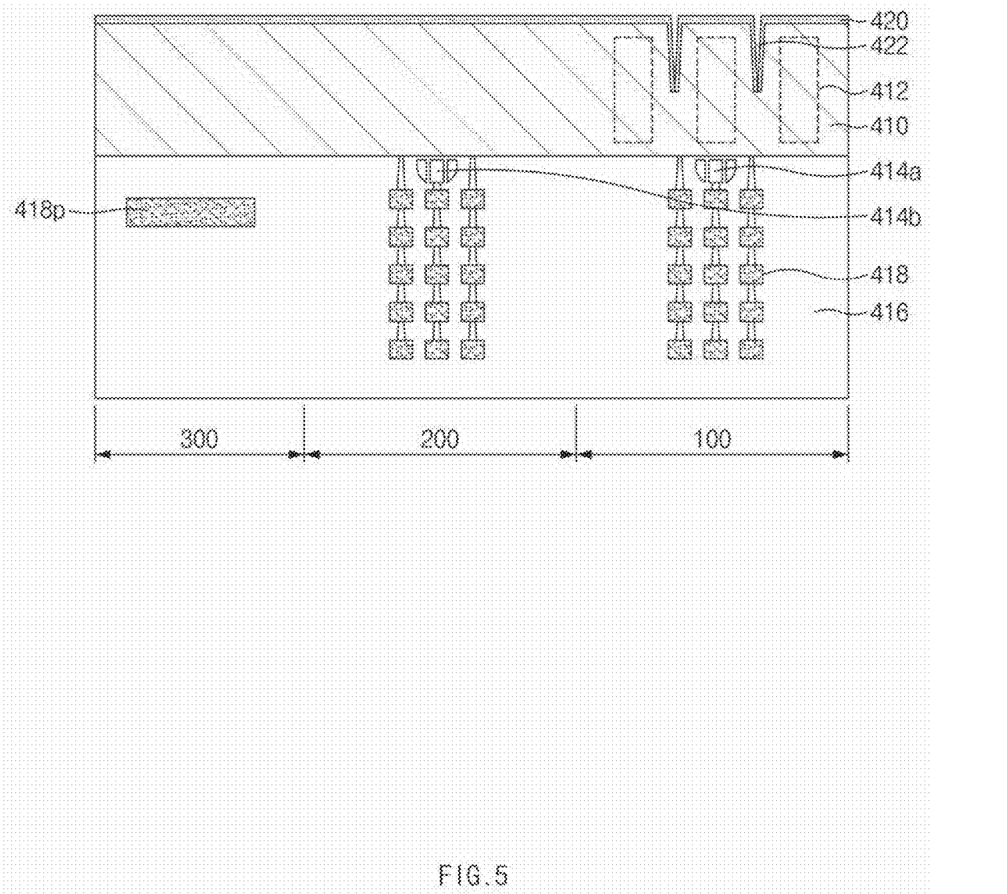
FIGS. 5 to 10 are cross-sectional views illustrating examples of methods for forming noise blocking structures shown in FIGS. 1 and 2 based on some implementations of the disclosed technology.

Referring to FIG. 5, a plurality of photoelectric conversion elements 412 may be formed in a semiconductor substrate 410 of the pixel region 100. Each of the photoelectric conversion elements 412 may be include a photodiode (PD) including an N-type impurity region and a P-type impurity region, and may be formed through, e.g., impurity-ion implantation.

Thereafter, at a front side of the semiconductor substrate 410, a plurality of pixel transistors 414a for reading out photoelectric conversion signals acquired by the photoelectric conversion elements 412 and controlling unit pixels may be formed in the pixel region 100, and a plurality of logic transistors 414b of the logic circuits to process the signals read out from the pixel region 100 may be formed in the logic region 200.

Subsequently, interlayer insulation films 416 and metal lines 418 may be formed over the pixel transistors 414a and the logic transistors 414b. In this case, a metal line 418P coupled to a pad may be formed in the pad region 300, and the metal line 418P may be formed in a first metal layer (M1).

After a mask pattern (not shown) defining a device isolation region is formed at a back side of the semiconductor substrate 410, the semiconductor substrate 410 may be etched using the mask pattern as an etch mask, resulting in formation of a device isolation trench (not shown). Subsequently, after an anti-reflection film 420 is formed at the front side of the semiconductor substrate 410 including the device isolation trench, an insulation material for device isolation may be buried in the device isolation trench, resulting in formation of a device isolation film 422.

Figure 6:
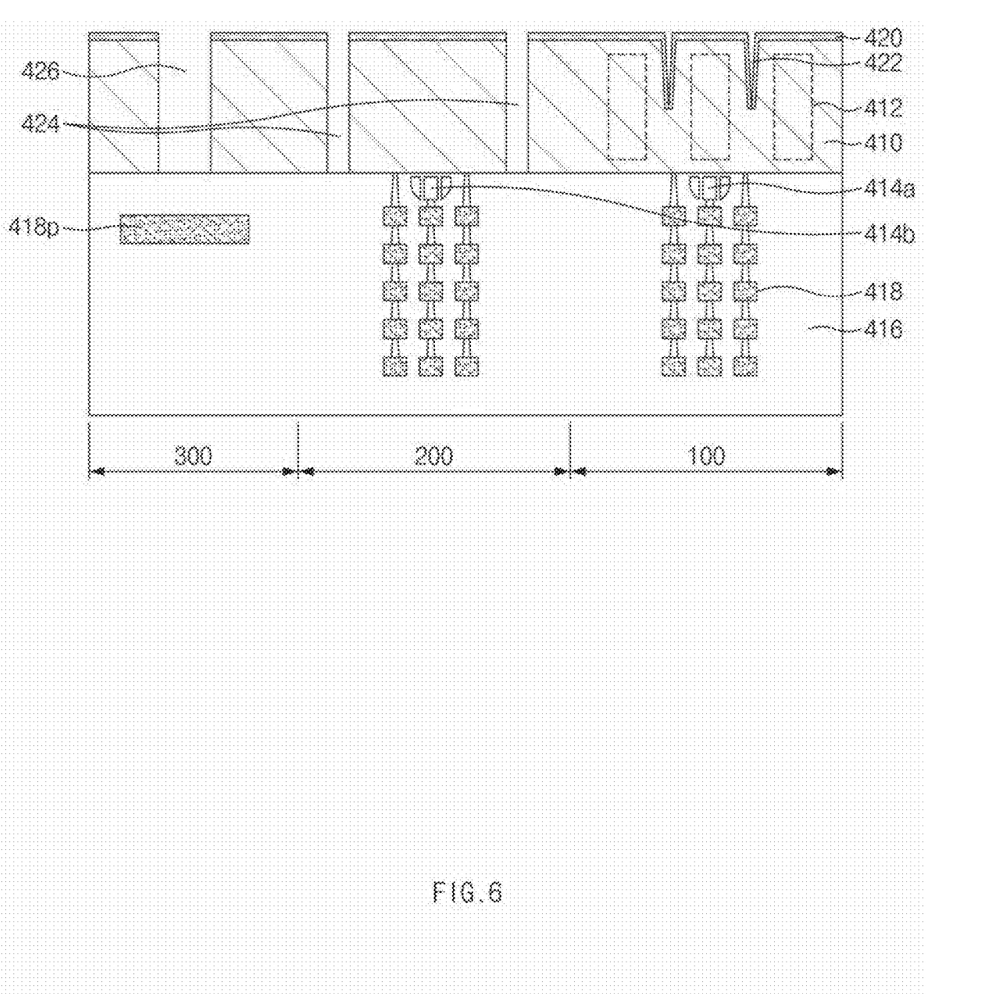

Referring to FIG. 6, the anti-reflection film 420 and the semiconductor substrate 410 may be etched, resulting in formation of through-holes 424 and 426. The regions passing through the semiconductor substrate 410 can be used as formation regions of the noise blocking films of the noise blocking structure 220 in the logic region 200 and as formation regions of pads in the pad region 300.

For example, after a mask pattern (not shown) formed to define not only the region to be used as a formation region of the pad 310 shown in FIG. 1, but also regions to be used as formation regions of the line-shaped noise blocking films 220a1 to 220a4 and 220b1 to 220b4 shown in FIG. 3 is formed at the back side of the semiconductor substrate 410, the anti-reflection film 410 and the semiconductor substrate 410 contained in the corresponding region may be etched using the mask pattern as an etch mask, such that through-holes 424 and 426 may be simultaneously formed. Thus, through-holes 424 for forming the linear-shaped noise blocking films 220a1~220a4 and 220b1~220b4 may be formed simultaneously with formation of the through-hole 426 for pad formation.

Figure 7:
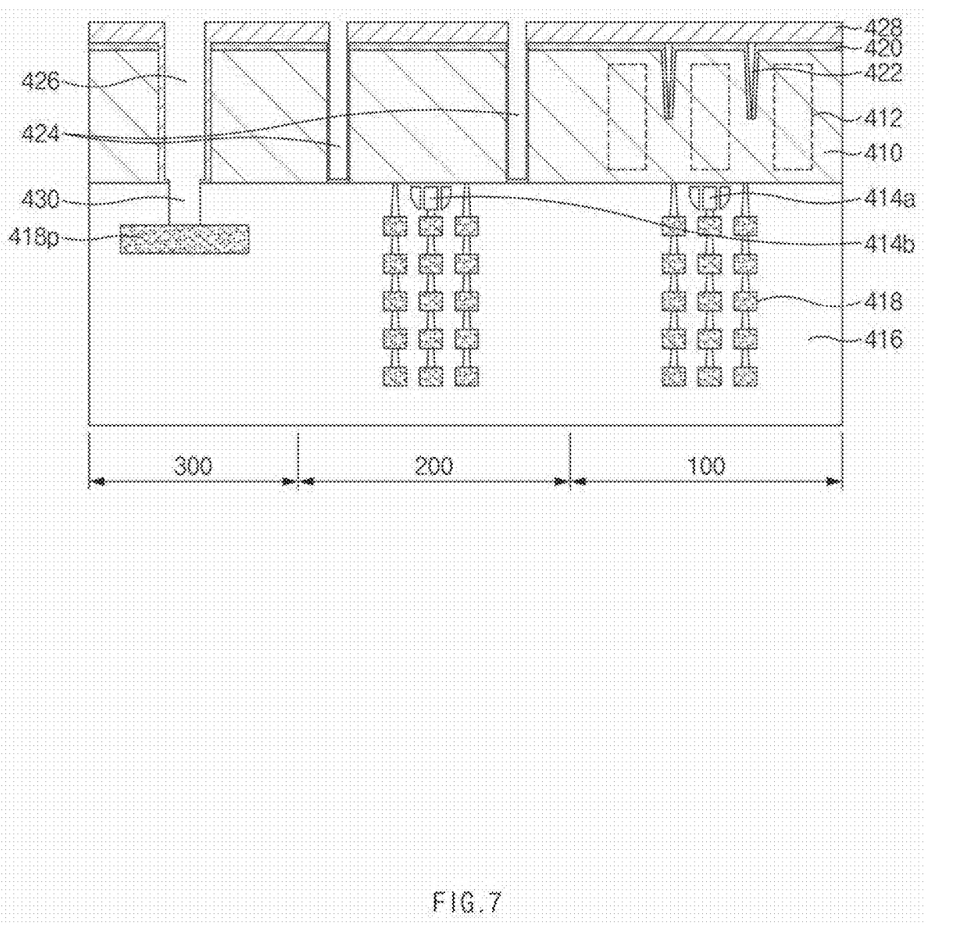

Referring to FIG. 7, at least one insulation film 428 may be formed over the resultant structure of FIG. 6. For example, the insulation films 428 may be formed at inner surfaces of the through-holes 424 and 426, at top surfaces of the interlayer insulation films 416 exposed by the through-holes 424 and 426, at top surfaces of the anti-reflection films 420, and at top surfaces of the device isolation films 422. Each of the insulation films 428 may include an oxide film 428, and may be used to planarize an upper portion of the pixel region 100.

Subsequently, the interlayer insulation film 416 exposed by the through-hole 426 may be etched, such that a trench 430 exposing the metal line 418P may be formed.

Figure 8:
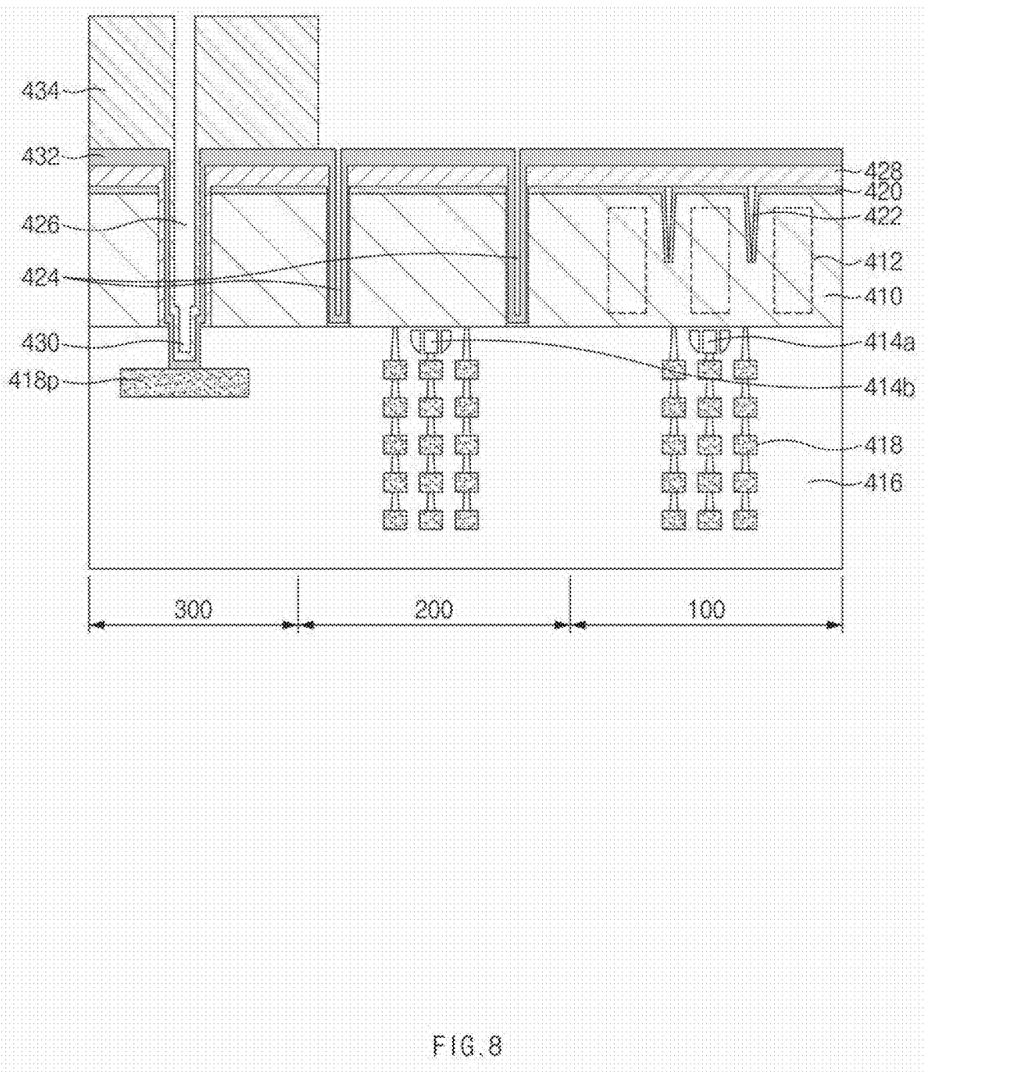

Referring to FIG. 8, a metal film (e.g., tungsten film) 432 may be formed over the resultant structure of FIG. 7. For example, the metal film 432 may be formed not only at a top surface of the oxide film 428, but also at an inner surface (e.g., side and bottom surfaces) of the trench 430. The metal film 432 may include tungsten (W), and may be connected to ground.

Although FIG. 8 illustrates that the metal film 432 is formed at an inner surface (e.g., side and bottom surfaces) of the through-hole 424, the through-hole 424 may also be formed to be filled with the metal film 432. Alternatively, if the through-hole 424 is formed to have a small width, the metal film 432 may not enter the through-hole 424, and an upper portion of the through-hole 424 may be covered (closed) by the metal film 432, such that only an airgap may also be formed in the through-hole 424.

Subsequently, after a metal film for pad formation is formed over the metal film 432 of the pad region 300, the metal film may be patterned to form a pad 434.

Figure 9:
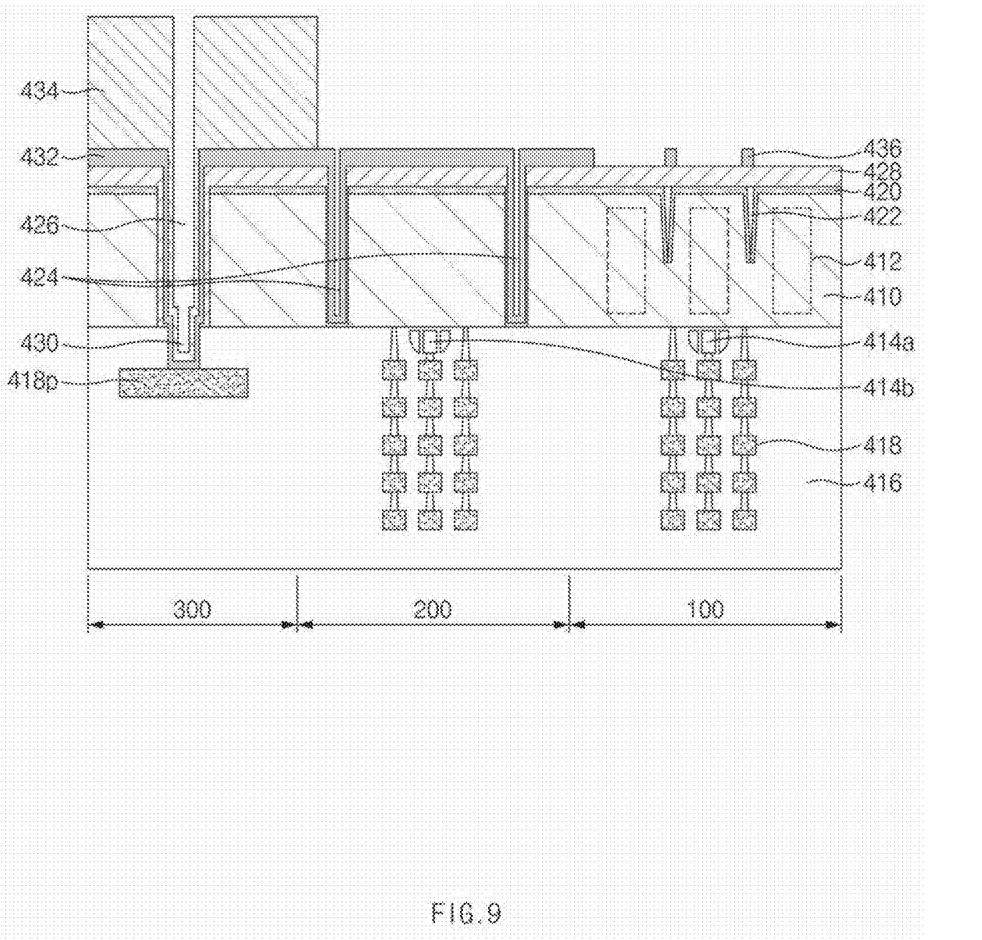

Referring to FIG. 9, the metal film 432 of the pixel region 100 may be patterned such that a grid structure 435 for preventing occurrence of crosstalk between the unit pixels may be formed.

The metal film 432 may not be patterned in the logic region 200 and the pad region 300, and may cover the entirety of the regions 200 and 300, such that the metal film 432 may be used as a shielding film to prevent light from being incident upon the regions 200 and 300.

The grid structure 436 may be disposed between color filters of the unit pixels.

Figure 10:
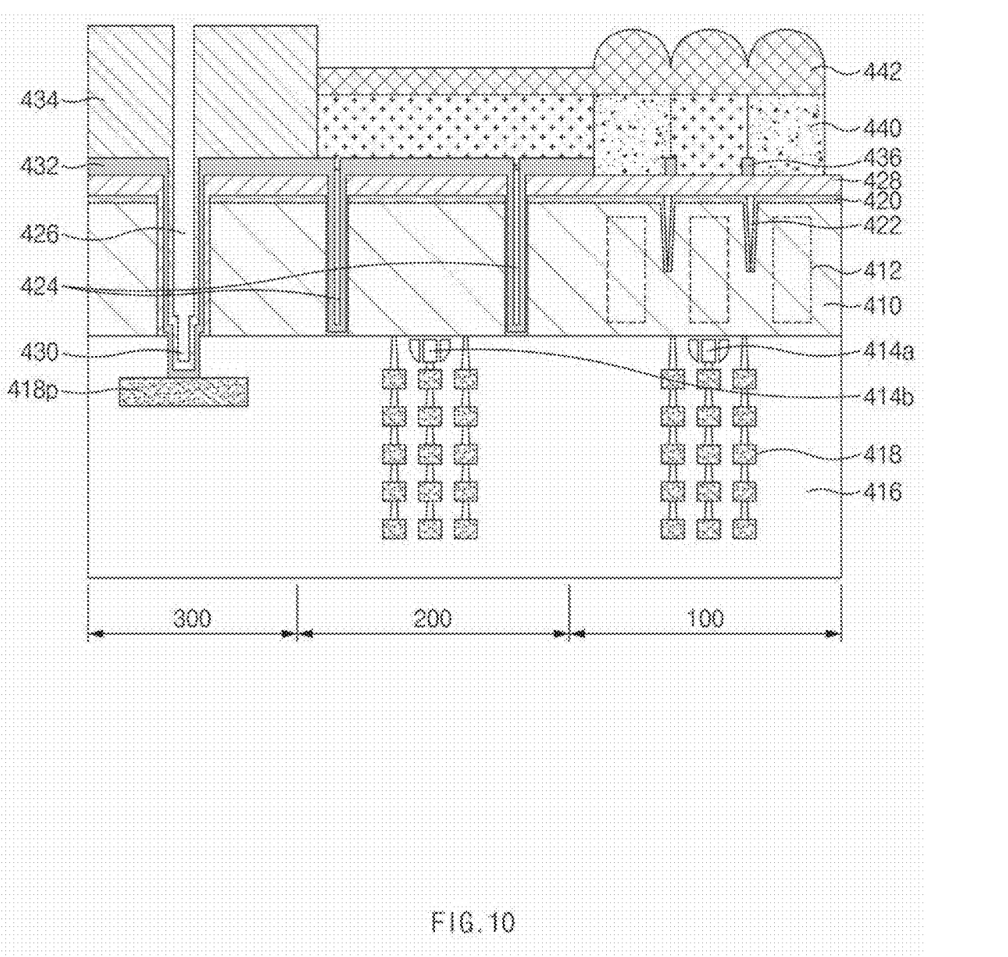

Referring to FIG. 10, color filter layers 440 may be formed not only over the oxide film 428 of the pixel region 100, but also over the grid structure 436, and microlenses 442 may be formed over the color filter layers 440.

In this case, when each through-hole 424 in which the metal film 430 is formed has a small width and the color filter layers 440 are formed over the through-hole 424, a resist material for color filters may be formed to cover (or close) an upper portion of the through-hole 424 without being inserted into the through-hole 424, such that an airgap may be formed in the through-hole 424. Thus, although the upper portion of the through-hole 424 is not covered by the metal film 432 in the fabrication method of FIG. 8, the upper portion of the through-hole 424 may be covered by the resist material in the process of forming the color filter layers 440, such that an airgap may be formed in the through-hole 424. Therefore, each of the noise blocking films may be formed as a stacked structure of the metal film and the airgap.

Figure 11:
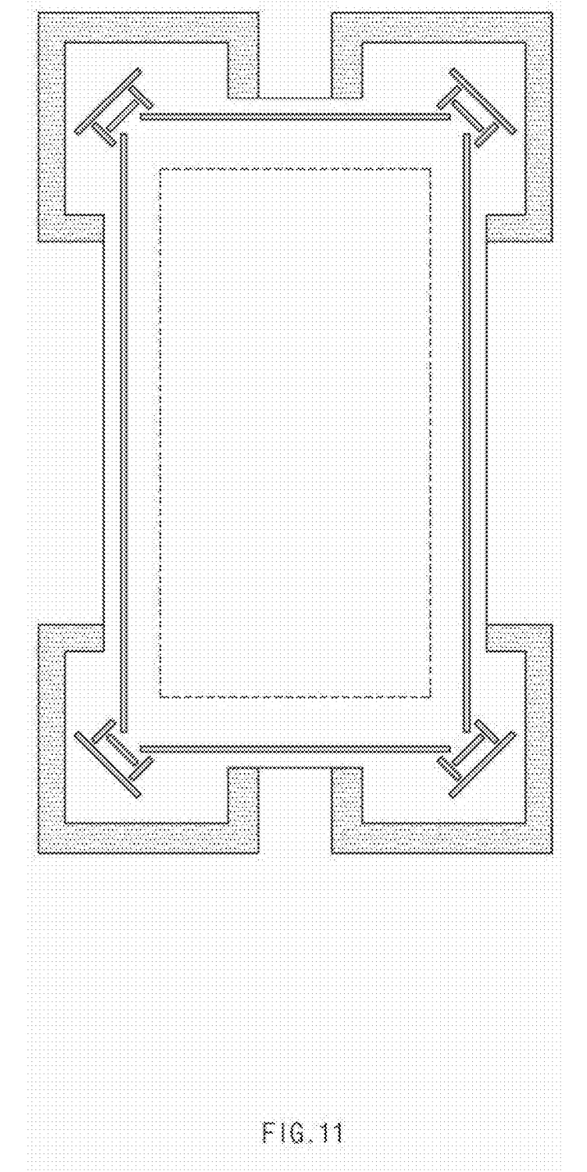
FIG. 11 is a plan view illustrating an example of a noise blocking structure based on some implementations of the disclosed technology.

FIG. 11 is a plan view illustrating a noise blocking structure based on some implementations of the disclosed technology.

An arrangement structure of the second blocking structure shown in FIG. 11 may be different from the second blocking structure 220b of FIG. 3.

The second blocking structure of FIG. 3 and the second blocking structure of FIG. 11 are disclosed only for illustrative purposes, the noise blocking films of the second blocking structure may be arranged in various shapes to prevent noise from leaking outside through the open portion of the first blocking structure 220a.

As is apparent from the above description, the image sensing device according to the embodiments of the disclosed technology may effectively prevent noise generated from a logic circuit block from leaking outside. Thus, the analog block of the image sensing device can be prevented from being affected by the generated noise, and characteristics of the image sensing device can be improved.

Although a number of illustrative embodiments have been described, it should be understood that numerous other modifications and embodiments can be devised by those skilled in the art that will be made.

What is claimed is:

1. An image sensing device comprising:
a semiconductor substrate structured to support a plurality of image pixels producing signals in response to received incident light, a logic circuit configured to process the signals read out from the image pixels, and a noise blocking structure coupled to the logic circuit to reduce a noise generated by the logic circuit,
wherein the noise blocking structure formed to extend in a straight line without any bending portion in a first direction, and to pass through the semiconductor substrate in a second direction that is perpendicular to the first direction.

2. The image sensing device according to claim 1, wherein the noise blocking structure includes:
first noise blocking portions which are spaced apart from each other by a predetermined distance and arranged to surround the logic circuit; and
second noise blocking portions which are spaced apart from each other by a predetermined distance, and arranged in outer walls of the first noise blocking structure.

3. The image sensing device according to claim 2, wherein the first noise blocking portions are arranged in a polygonal belt shape including openings in which the first noise blocking portions are not present.

4. The image sensing device according to claim 3, wherein the second noise blocking portions are arranged around the openings of the first noise blocking portions.

5. The image sensing device according to claim 1, wherein the noise blocking structure includes a metal film and an airgap.

6. The image sensing device according to claim 1, wherein the noise blocking structure is formed in a P-well region of the semiconductor substrate.

7. The image sensing device according to claim 6, further comprising:
an N-well region formed to surround an outer wall of the P-well region.

8. The image sensing device according to claim 1, wherein the logic circuit is formed in a lower portion of the semiconductor substrate.

9. An image sensing device comprising:
a semiconductor substrate configured to include image pixels producing signals upon a detection of an incident light and a logic circuit region processing the signals produced by the image pixels; and
a noise blocking structure disposed at the semiconductor substrate and including:
a first blocking structure including first noise blocking portions distanced apart from each other by an opening and partially surrounding the logic circuit region, each of the first noise blocking portions extending in a straight line; and
a second blocking structure disposed around the opening to prevent the noise from leaking out of the first blocking structure and including second noise blocking portions extending in a straight line.

10. The image sensing device according to claim 9, wherein each of the first and second blocking structure pass through the semiconductor substrate in a vertical direction.

11. The image sensing device according to claim 9, wherein the first noise blocking portions arranged in a polygonal belt shape including openings in which the first noise blocking portions are not present.

12. The image sensing device according to claim 9, wherein the second noise blocking portions are spaced apart from each other by a predetermined distance.

13. The image sensing device according to claim 9, wherein each of the first and second noise blocking portions includes a metal film and an airgap.

14. The image sensing device according to claim 13, wherein the metal film includes a material that is identical to at least one of a material of a grid structure of the pixel region or a material of a shielding film formed over the logic circuit region.

15. The image sensing device according to claim 9, wherein the first blocking structure and the second blocking structure are formed in a P-well region of the semiconductor substrate.

16. The image sensing device according to claim 15, further comprising:
   an N-well region formed to surround an outer wall of the P-well region.

17. The image sensing device according to claim 9, wherein the at least one logic circuit region is formed in a lower portion of the semiconductor substrate.

18. An image sensing device comprising:
   a pixel region provided with a plurality of image pixels producing signals upon a detection of an incident light; and
   a logic region located outside of the pixel region and including:
      a logic circuit configured to process the signals produced by the image pixels,
      a first noise blocking structure disposed outside of the logic circuit and discontinuously surround the logic circuit, and
      a second noise blocking structure disposed outside of the first noise blocking structure and including multiple discrete portions structured in a maze-like arrangement.

19. The image sensing device according to claim 18, wherein the first noise blocking structure includes:
   a plurality of line-shaped noise blocking films that are distanced apparat from each other.

20. The image sensing device according to claim 19, wherein the plurality of the line-shaped noise blocking films are located along a boundary of the logic circuit and spaced apart from the logic circuit.

21. The image sensing device according to claim 19, wherein the multiple discrete portions of the second noise blocking structure are shorter in length than that of each of the plurality of line-shaped noise blocking films.

22. The image sensing device according to claim 18, wherein the logic circuit is formed in a lower portion of a semiconductor substrate.

* * * * *